United States Patent [19]

Denis

[11] 4,292,675
[45] Sep. 29, 1981

[54] FIVE DEVICE MERGED TRANSISTOR RAM CELL

[75] Inventor: Bernard A. Denis, Mennecy, France

[73] Assignee: International Business Machines Corp., Armonk, N.Y.

[21] Appl. No.: 61,973

[22] Filed: Jul. 30, 1979

[51] Int. Cl.³ .............................................. G11C 11/40
[52] U.S. Cl. .................................. 365/156; 307/288; 357/44; 357/92
[58] Field of Search .............. 307/238, 279, 289, 291, 307/288; 357/44, 92; 365/154, 156, 174, 177, 181, 188, 205

[56] References Cited

U.S. PATENT DOCUMENTS 3,815,106 6/1974 Wiedmann ................ 307/291 X
3,986,178 10/1976 McElroy et at. ........... 307/291 X
4,081,697 3/1978 Nakano ...................... 357/92 X
4,150,392 4/1979 Nonaka ...................... 307/279 X

OTHER PUBLICATIONS

S. K. Wiedmann, MTL Storage Cell, IBM Technical Disclosure Bulletin, vol. 21, No. 1, Jun., 1978, pp. 231–232.

Primary Examiner—John Zazworsky
Attorney, Agent, or Firm—Robert J. Haase

[57] ABSTRACT

A five device RAM cell comprising a four device Merged Transistor Logic (MTL) cell plus a separate sense line and a fifth bipolar transistor device having a collector connected to one node of the cell, a base connected to the other node of the cell, and an emitter connected to the sense line.

7 Claims, 7 Drawing Figures

FIVE DEVICE MERGED TRANSISTOR RAM CELL

BACKGROUND OF THE INVENTION

This invention generally relates to random access memory cells and, more particularly, to an improved Merged Transistor Logic (MTL) memory cell characterized by enhanced readability and increased immunity to noise. The MTL cell is also known in the art as the Integrated Injection Logic ($I^2L$) cell.

The basic MTL cell is disclosed in an article by S. K. Wiedmann in the IBM Technical Disclosure Bulletin, Vol. 21, No. 1, June 1978, page 231. Briefly, the MTL storage cell comprises two vertical NPN transistor inverters cross-coupled in the manner of a flip-flop. The flip-flop nodes are coupled to bit-sense lines by respective lateral PNP transistors. The collector of a lateral transistor and the base of a corresponding vertical transistor share (are merged into) the same P-type semiconductor region. Additionally, the bases of the lateral transistor and the emitters of the vertical transistors share (are merged into) the same N-type buried semiconductor region which also is connected to a word line. The vertical transistors are operated in the inverse mode, i.e., the emitters are formed by a buried region and the collectors are formed by a region on the surface of the semiconductor substrate.

The sense current from the MTL cell results in a voltage change ($\Delta V$) between the bit lines which is detected to determine the state of the cell. The magnitude of $\Delta V$, in turn, determines the speed and reliability with which the status of the cell can be sensed especially in the presence of noise. The MTL cell requires a certain minimum waiting time, however, following cell selection, before the sense of the stored data may be read out reliably. Although the waiting time is entirely acceptable for many applications, it is desirable to decrease reading time to broaden the applicability of the MTL cell. It is further desirable to achieve such a performance improvement while increasing the $\Delta V$ sense voltage.

SUMMARY OF THE INVENTION

The reading time is decreased and the magnitude of the sense voltage increment is increased relative to the MTL cell by the provision of an additional bipolar transistor to a four transistor device MTL storage cell. The emitter to collector path of the additional transistor is connected between a sense line and one of the cell nodes. The base of the additional transistor is connected to the other cell node. When the addressed cell is in one state, the additional transistor is turned on to provide a low impedance path which quickly decreases the sense line voltage through an increment. The incremental voltage change on the sense line (sense voltage) is more than an order to magnitude greater than is the case with the conventional MTL cell. Additionally, the polarity of the sense voltage remains the same during the transient time while it reaches its steady state value. In contrast, there is a brief reversal of sense voltage polarity during the corresponding transient time of the conventional MTL cell. Accordingly, a minimum waiting time must be allocated before the sense voltage is sampled. Such waiting time is significantly reduced in accordance with the present invention.

DESCRIPTION OF THE PREFERRED EMBODIMENT

Figure 1:
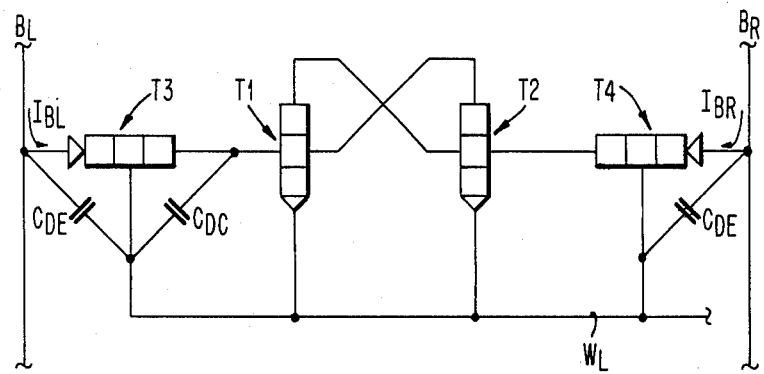
FIG. 1 is a schematic diagram of a conventional MTL storage cell.

As previously stated, the conventional MTL cell of FIG. 1 is characterized by a brief inversion of the sense of the stored data immediately upon reading. The polarity of the sense voltage, which is measured between the bit lines, represents the sense of the stored data. This sometimes limiting result can be understood by a brief review of the structure and operations of the prior art MTL storage cell of FIG. 1.

The storage cell comprises cross-coupled vertical NPN transistors T1 and T2 whose bases are connected to respective bit-sense lines $B_L$ and $B_R$ by respective lateral PNP transistors T3 and T4. High density layout of the cell is achieved by merging the collector of a lateral transistor (such as T3) with the base of a corresponding vertical transistor (such as T1) into the same P-type semiconductor region. In a similar manner, the bases of the lateral transistors T3 and T4 are merged with the emitters of the vertical transistors T1 and T2 and with the word line $W_L$ by sharing the same N-type buried semiconductor region.

In reading the data previously stored in an MTL cell, the word line $W_L$ is pulled down about 0.4 volt to a value of about 0 volt. Equal and constant read currents are applied to the bit lines of the selected cell. Assuming that T1 is "on" and that T2 is "off" at the time that the status of the cell is being sensed, T3 is placed into a saturation condition, with equal emitter and collector voltages of about 0.8 volt. All current coming into the left cell node from bit line $B_L$ flows through diffusion capacitances $C_{DE}$ and $C_{DC}$ of T3.

From an alternating current point of view, capacitors $C_{DE}$ and $D_{DC}$ of T3 can be considered to be connected in parallel because of the same potential (0.8 volt) on both its emitter and collector electrodes. The result is a relatively high coupling capacitance between word line $W_L$ and bit line $B_L$. It should also be noted that the magnitude of diffusion capacitance is proportional to the current flowing through it and, as previously pointed out, all of the current coming into the cell from bit line $B_L$ flows through the paralleled diffusion capacitances $C_{DE}$ and $C_{DC}$.

Looking now at the other side of the cell, T4 also is "on" but is not in the saturation condition. Its emitter and collector potentials, in the example given, are 0.8 volt and 0 volt, respectively. Consequently, a part of the right bit line $B_R$ current flows through the emitter to collector path of T4 with only the remaining current passing through the diffusion capacitance $C_{DE}$ of T4. Since the currents flowing into the cell from $B_L$ and $B_R$ are equal, the current passing through $C_{DE}$ of T4 is less than the current passing through $C_{DE}$ and $C_{DC}$ of T3. Thus, the coupling capacitance between $W_L$ and $B_R$ is appreciably smaller than the coupling capacitance between $W_L$ and $B_L$.

Figure 2A:
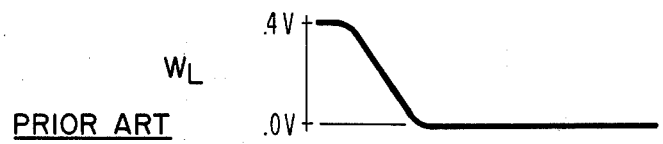
FIGS. 2A, 2B and 2C are typical waveforms developed by the cell of FIG. 1 when it is read.
Figure 2B:
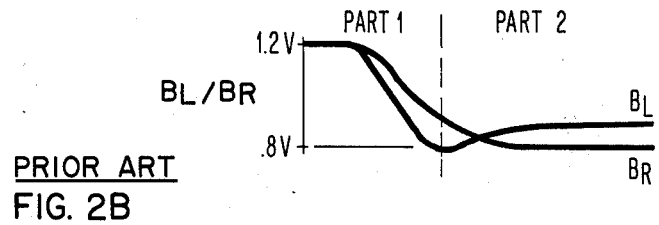

From the foregoing considerations, it can be seen that the fall time of the right bit line $B_R$ is slower than that of the left bit line $B_L$. This follows from the fact that the fall of the word line $W_L$ potential as shown in FIG. 2A is coupled to $B_R$ through a capacitance smaller than the capacitance coupling to $B_L$. The respective bit line potentials on $B_L$ and $B_R$ are shown in FIG. 2B. It should be noted that the more rapid discharge of potential on $B_L$ is characterized by a recovery portion which rises above the steady state potential on $B_R$ at the completion of the read operation.

Figure 2C:
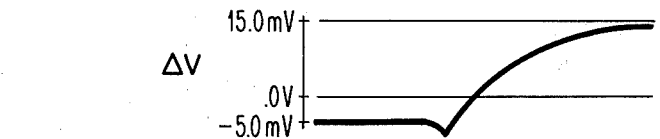

The sense voltage $\Delta V$, as shown in FIG. 2C, is measured between the two bit lines $B_L$ and $B_R$. Immediately following cell selection, the polarity of the sense voltage is determined by the rates with which the bit line potentials fall. This polarity inverts, however, as the two bit lines assume their respective steady state values, due to the recovery of the potential on $B_L$. It will be recalled that $B_L$ is coupled to the collector of the transistor T2 which was assumed to be "off" (and, hence, at a higher potential) in the example under consideration. The reversal of the sense voltage polarity requires that an appropriate time interval be allocated before the cell status can be reliably sensed. The required time interval depends upon the speed of the lateral PNP transistor T3 in reestablishing the saturation current flowing through it following cell selection. Because of the relatively low speed of the lateral PNP transistor, the recovery of the left bit line $B_L$ potential is delayed until after the word line $W_L$ potential has fallen.

In the reading operation of the prior art cell of FIG. 1, assume that T1 is "on" and T2 is "off". Cell selection is performed by pulling down the word line $W_L$ to a potential of about 0.4 volt. Reading current is sent into the selected cell from the bit lines. Because the emitter and collector voltages of T3 are the same, that transistor is in its saturation mode. Its forward biased base-emitter junction injects carriers into the adjacent common N region which carries are partially collected by the injection P region (emitter of T3). The resulting current $I_S$ on bit line $B_L$ is dependent on the lateral current gain of the PNP transistor T3 and can be sensed to detect the state of the cell. $I_S$ results in a potential difference $\Delta V$ between the bit lines $B_L$ and $B_R$ in accordance with the expression:

$$\Delta V = kT/q \ln 1/(1-\alpha_I \alpha_N) \text{ where } kT/q \approx 0.026 \text{ volt,}$$

and $\alpha_I$ reverse current gain and $\alpha_N$ forward current gain typically are 0.6 and 0.8, respectively.

In the given case, $\Delta V$ is only about 0.017 volt.

Figure 3:
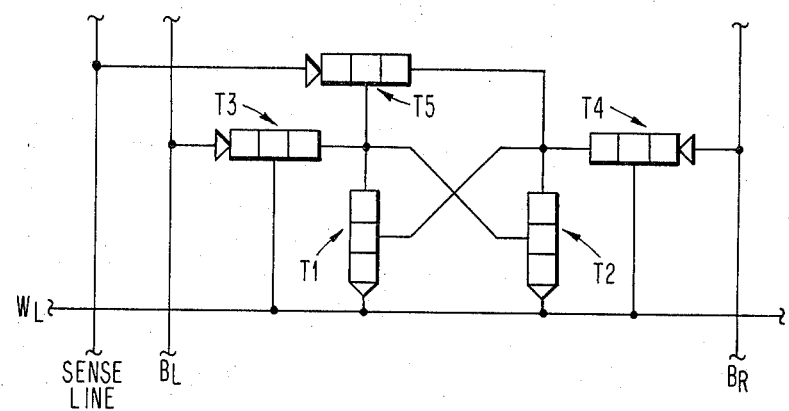
FIG. 3 is a schematic diagram of the improved MTL cell of the present invention.

In accordance with the modified MTL cell of the present invention shown in FIG. 3, however, not only is the sensing speed of the prior art cell of FIG. 1 enhanced but the polarity reversal of the sense voltage is eliminated. It will also be shown that the amplitude of the sense voltage $\Delta V$ also is increased to provide better readability in the presence of noise. It will be noted that the connections of transistors T1, T2, T3 and T4 to the bit lines and to the word line is the same in the modified MTL cell of FIG. 3 as in the prior art MTL cell of FIG. 1. The modified MTL cell of FIG. 3 also includes a separate sense line and a fifth bipolar transistor T5 of the PNP type having base and collector electrodes connected to the respective MTL cell nodes and an emitter connected to the sense line. As in the case of FIG. 1, T1 and T2 of FIG. 3 are NPN transistors operated in the inverted mode, T3 and T4 are lateral PNP transistors and the bases of T3 and T4, the effective emitters of T1 and T2 and the word line are merged into one N-type semiconductor region. The collector of T3 and the base of T2 are merged into one P-type semiconductor region while the collector of T4 and the base of T1 are merged into another P-type semiconductor region. The additional transistor T5 is a vertical PNP transistor which is connected by conductive pathways to the MTL cell nodes and to the sense line as will be shown later with the aid of FIGS. 4 and 5. Standby current is supplied to the cell of FIG. 3 through T3 and T4 by a current generator (not shown) connected to the bit lines.

In the reading operation of the cell of FIG. 3, assume that T1 is "on" and T2 is "off". Cell selection is accomplished by pulling down the word line $W_L$. The collector of T1 is low and the transistor T5 is "on". Because the two transistors T1 and T5 are "on", a low impedance pathway is formed between the word line $W_L$ and the sense line which causes a fast lowering of the sense line potential as the cell is selected. If T1 is "off" and T2 is "on" (the reverse case), the number of cells in the opposite state and connected to the same bit line column determine the potential of the sense line. The worst case configuration occurs when all of the other cells connected to the same bit line column are in a state opposite to the state of the selected cell. The lowest sense line potential occurs when only T1 of the selected cell is "on". The minimum sense line voltage increment $\Delta V$ which can be used to sense the state of the selected cell (in the worst case configuration) is $$\Delta V = \Delta V_{WL} - kT/q \ln N$$

where $\Delta V_{WL}$ is the $\Delta V$ between the potential of the selected word line and the potential of the unselected word line.

Typically, $\Delta V_{WL}$ is 0.4 volt, $kt/q$ is 0.026 volt and N is the number of cells, say 127, which are in the state opposite to the state of the selected cell.

Thus, $\Delta V$ in the example given is 0.274 volt which is a substantial improvement over the $\Delta V$ of 0.017 volt in the preceding example of the prior art MTL cell. Not only does the sense current through T5 significantly increase the $\Delta V$ voltage on the sense line, there also is no $\Delta V$ voltage polarity reversal as in the prior art MTL cell. Furthermore, the sense current through T5 tends to reinforce the pre-existing state of the selected cell rather than disturb it. Thus, sensing is accomplished faster and more reliably especially in the presence of noise.

Figure 4:
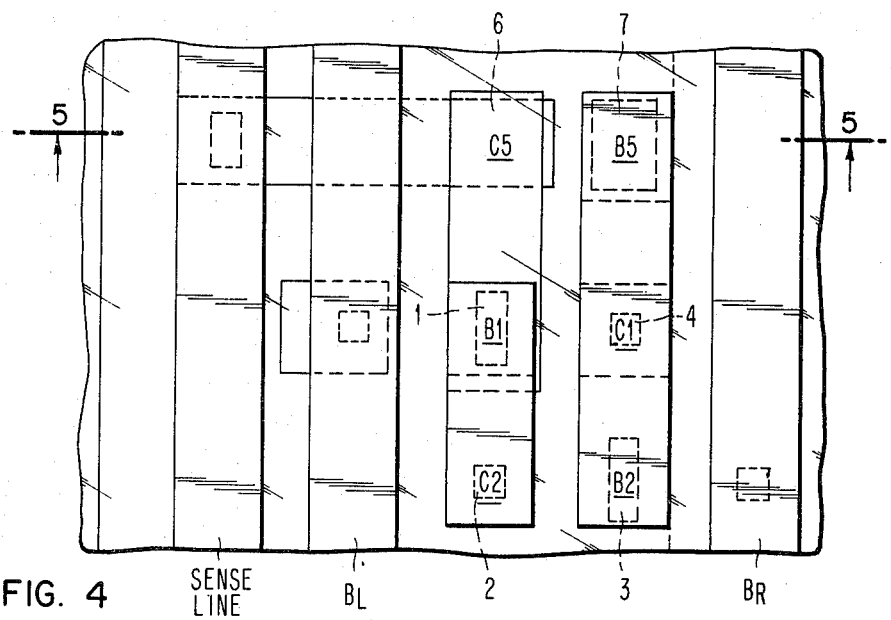
FIG. 4 is a plan view of the cell layout of a preferred embodiment of the present invention.
Figure 5:
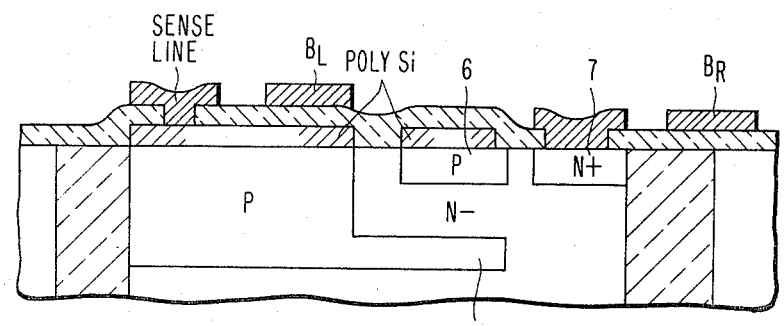
FIG. 5 is a cross-sectional view of the structure of FIG. 4 taken along the line 6—6.

The layout of the improved cell of FIG. 3 is shown in FIG. 4 and is similar to the layout of the prior art cell of FIG. 1, as shown in the aforementioned IBM Technical Disclosure Bulletin of June 1978, page 231, except for the addition of the sense line and vertical PNP transistor T5 (shown in cross section in FIG. 5). Briefly, bit lines $B_L$ and $B_R$ and the sense line are formed by surface metallization over an insulating layer on a substrate in which the transistors T1, T2, T3, T4 and T5 are formed. A conductive pathway of polycrystalline silicon is provided as indicated to connect the base 1 of T1 to the collector 6 of T5. The base 3 of T2 is connected by metal to the collector 4 of T1 and to the base 7 of T5. The collector 2 of T2 is connected by metal to the base 1 of T1. It will be recalled that the emitters of T1 and T2, the word line $W_L$ and the bases of T3 and T4 are all formed by the same buried N region and for that reason are not shown in the plan view of FIG. 4.

T5 is further shown in the cross-sectional view of FIG. 5. Like T1 and T2, T5 also has a buried emitter (8) and a collector (6) located at the top surface of the semiconductor substrate. This arrangement allows the addition of T5 to the pre-existing prior art MTL layout with minimum increase of cell surface area while using a compatible fabrication process.

While the invention has been particularly shown and described with reference to the preferred embodiment thereof, it will be understood by those skilled in the art that various changes in form and detail may be made therein without departing from the spirit and scope of the invention.

Having thus described my invention, what I claim as new, and desire to secure by Letters Patent is:

1. A bipolar transistor memory array cell, each transistor of said cell having collector, base and emitter, said cell comprising:
    a pair of flip-flop cross-connected transistors having a pair of nodes corresponding to the collectors of said cross-connected transistors,
    a pair of bit lines,
    a word line,
    a pair of input-output transistors of a type complementary to said flip-flop transistors connecting said nodes to said bit lines via the emitter-collector current paths thereof, the bases of said input-output transistors and the emitters of said cross-connected transistors being connected to said word line,
    a sense line, and
    a sense transistor,
    the collector of said sense transistor being connected to one of said nodes;
    the base of said sense transistor being connected to the other of said nodes, and
    the emitter of said sense transistor being connected to said sense line.

2. The cell defined in claim 1 wherein said cross-connected transistors are NPN transistors and said input-output and said sense transistors are PNP transistors.

3. The cell defined in claim 2 wherein said NPN transistors are vertical transistors operated in the inverse mode.

4. The cell defined in claim 2 wherein said input-output transistors are lateral transistors.

5. The cell defined in claim 2 wherein said sense transistor is a vertical transistor.

6. The cell defined in claim 2 wherein the bases of said input-output transistors, the emitters of said NPN transistors and said word line are merged into the same N-type semiconductor region.

7. The cell defined in claim 2 wherein the collector of each said input-output transistor and the base of a respective NPN transistor are merged into the same P-type semiconductor region.

* * * * *